(12) United States Patent
Tsironis

(10) Patent No.: US 11,821,930 B1
(45) Date of Patent: Nov. 21, 2023

(54) HIGH DIRECTIVITY SIGNAL COUPLER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 17/724,860

(22) Filed: Apr. 20, 2022

(51) Int. Cl.
*G01R 27/32* (2006.01)
*H01P 5/04* (2006.01)
*G01R 31/28* (2006.01)

(52) U.S. Cl.
CPC ......... *G01R 27/32* (2013.01); *G01R 31/2822* (2013.01); *H01P 5/04* (2013.01)

(58) Field of Classification Search
CPC ........ G01R 27/32; G01R 31/2822; H01P 5/04
See application file for complete search history.

(56) References Cited

U.S. PATENT DOCUMENTS

| | | | |
|---|---|---|---|
| 5,461,349 A * | 10/1995 | Simons | H04N 7/104 333/112 |
| 7,135,941 B1 | 11/2006 | Tsironis | |
| 7,282,926 B1 | 10/2007 | Verspecht et al. | |
| 7,548,069 B2 | 6/2009 | Simpson | |
| 7,606,592 B2 * | 10/2009 | Becker | H01P 5/12 330/95 |
| 2004/0222867 A1 * | 11/2004 | Antkowiak | H01P 5/183 333/127 |
| 2010/0225415 A1 * | 9/2010 | Subedi | H01P 5/183 333/111 |
| 2011/0080158 A1 * | 4/2011 | Lawrence | H01R 24/42 324/76.12 |

OTHER PUBLICATIONS

Load Pull for Power Devices [online], Microwaves101 [retrieved on Mar. 14, 2017]. Retrieved from Internet <www.microwaves101. com/encyclopedias/ load-pull-for-power-devices>.
"Computer Controlled Microwave Tuner", Product Note 41, Focus Microwaves, Jan. 1998.
S-parameters [online], Microwaves101 [retrieved on Apr. 28, 2020]. Retrieved from Internet <www.microwaves101.com/encyclopedias/s-parameters>.
Directional Couplers [online], Microwaves101 [retrieved on Oct. 17, 2018]. Retrieved from Internet <www.microwaves101.com/encyclopedia/directionalcouplers.cfm>.
Fourier analysis [online], Wikepidia [retrieved on Apr. 28, 2020]. Retrieved from Internet <www.en.wikipedia.org/wiki/Fourier_analysis>.

* cited by examiner

*Primary Examiner* — Akm Zakaria

(57) ABSTRACT

Low loss high directivity wire couplers use a transmission airline structure and a low diameter coaxial cable ending in a wire loop sensor, which is inserted into an elliptically formed conical opening of the ground wall of the transmission line and protrudes into its cavity leading into a coupled and an isolated port. Lower, capacitively induced, electrical currents, because of the protruding ground edges of the conical or recessed openings, compared with the unperturbed antiphase magnetically induced currents, lead to controlled higher directivity in a frequency range up to at least 170 GHz.

5 Claims, 9 Drawing Sheets

FIG. 3: Prior art: NUMBERED ITEMS ARE NOT REFERRED TO IN SPEC. (REF. 6)

HIGH DIRECTIVITY SIGNAL COUPLER

CROSS-REFERENCE TO RELATED ARTICLES

1. Load Pull for Power Devices [online], Microwaves101 [retrieved on 2017-03-14]. Retrieved from Internet <URL: https://www.microwaves101.com/encyclopedias/load-pull-for-power-devices>.
2. "Computer Controlled Microwave Tuner", Product Note 41, Focus Microwaves, Jan. 1998.
3. S-parameters [online], Microwaves101 [retrieved on 2020-04-28]. Retrieved from Internet <URL: https://www.microwaves101.com/encyclopedias/s-parameters>.
4. Directional Couplers [online], Microwaves101 [retrieved on 2018-10-17]. Retrieved from Internet <URL: http://www.microwaves101.com/encyclopedia/directional-couplers.cfm>.
5. Verspecht et al., U.S. Pat. No. 7,282,926, "Method and an apparatus for characterizing a high-frequency device-under-test in a large signal impedance tuning environment".
6. Simpson, G., U.S. Pat. No. 7,548,069, "Signal Measurement Systems and Methods".
7. Tsironis, C., U.S. Pat. No. 7,135,941, "Triple probe automatic slide screw load pull tuner and method".
8. Fourier analysis [online], Wikepidia [retrieved on 2020-04-28]. Retrieved from Internet <URL: https://en.wikipedia.org/wiki/Fourier_analysis>.

FIELD OF THE INVENTION

This invention relates to testing of microwave two-ports (transistors, DUT) using linear and non-linear measurement techniques especially under controlled impedances at the input and output of the transistors (load Pull measurement, see ref. 1) and also measuring and analyzing the large signal behavior of a DUT.

BACKGROUND OF THE INVENTION

A popular method for testing and characterizing microwave transistors at high power nonlinear operation is "load pull" and "source pull" (see ref 1). Load pull or source pull are measurement techniques employing microwave tuners (see ref 2) and other microwave test equipment. The microwave tuners in particular are used to manipulate the microwave impedance conditions under which the DUT (transistor) is tested (FIG. 1). Bi-directional signal couplers are needed to detect the signal waves propagating along the transmission line towards <a>and away <b>from the DUT (FIG. 1) and to allow performing harmonic Fourier analysis (see ref. 8) in order to reconstruct the real-time non-linear (non-sinusoidal) transistor response. Further-on the instantaneous voltage-current trajectory of a transistor, typically called the "load-line", (see ref 6) will depend on the complex impedance presented to the transistor at harmonic frequencies using harmonic tuners (see ref 7). A setup that allows this test is a "harmonic load pull setup" as shown in FIG. 1.

DESCRIPTION OF PRIOR ART

Bi-directional signal couplers have been known since long time (see ref. 4); They detect forward <a>and reverse <b>travelling waves on the transmission line and transfer the measured data to the vector network analyzer (VNA, FIG. 1). In order for the data to be valid the couplers must be calibrated by measuring their scattering (s-) parameters before (see ref. 3) and de-embed to the DUT reference plane.

Typical s-parameter calibration occurs under 50Ω termination conditions (FIG. 7). However, when the terminations are non-50Ω, as shown by arrow Γ2 in FIG. 1, the signal detection behavior, forward C (coupling) and reverse I (isolation) change. The signal detected at either (coupling and isolation) port comes from both the input port (forward wave) and as part of the signal returning (reverse wave) from a non-50Ω termination (Γ2) at the output port. In load pull operations in particular, the tuners create (on purpose) non-50Ω test conditions. The relation describing this phenomenon is:

$$\text{Coupling: } C(\Gamma 2) = S31 + S32 * S21 * \Gamma 2 / (1 - \Gamma 2 * S22)$$
$$\approx S31 + S32 * \Gamma 2 \qquad \{eq. 1\}$$

and $$\text{Isolation: } I(\Gamma 2) = S41 + S42 * S21 * \Gamma 2 / (1 - \Gamma 2 * S22)$$
$$\approx S41 + S42 * \Gamma 2 \qquad \{eq. 2\}$$

whereby Γ2 is the reflection created by the tuner at port 2 and C(Γ2) and I(Γ2) are the new values of the coupling transmission S31 and isolation S41 between port 1 and ports 3 and 4, or the ratio of signal power detected at ports 3 and 4, divided by the injected signal power into port 1 (FIG. 7). The Directivity is a coupler property defined as S31/S41=S42/S32, depending which port, 1 or 2, is defined as the input port. If Γ2=0 then C(0)=S31 and I(0)=S41, as follows from {eq.1, 2}. The important quantities are S32 and Γ2, that is the isolation and the load reflection factor; since |S21|≈1, and |S22|≈0 it is, finally, the product Γ2*S32 that determines the sensitivity of the coupling factor on the mismatch created by the tuner. An ideal-directivity coupler should therefore have a Directivity of infinite, or S41=S32=0. This not being possible, "Directivity" is a key and distinguishing performance of any directional coupler, especially when used in a non-50Ω, i.e. |Γ2|>0 test environment as shown in FIGS. 1 and 7. Commercially available compact wideband couplers (see ref. 5) have Directivity values between 10 and 20 dB. The coupler presented here is simpler to make, is extremely wideband and exceeds this level of Directivity.

BRIEF DESCRIPTION OF THE INVENTION

Signal couplers are in general bi-directional. When the isolated port (FIG. 7) is terminated with characteristic impedance, i.e., no signal is reflected back into the coupler, it is called a directional coupler, because the larger portion of the detected signal comes from one direction (forward). Of course, because these couplers are bi-directional, in reverse direction the isolated port becomes the coupled port, and the coupled port becomes the isolated port. The couplers dealt with in this disclosure are bi-directional couplers. The high directivity bi-directional signal coupler of the present invention (FIG. 5) uses an electro-magnetic 54, 53, 52 wire loop 58 protruding through a special either quasi elliptical conical or recessed opening into the transmission line, said line being either coaxial 51 or TEM waveguide. The coupler is made by immerging to a certain degree the "U"-shaped electro-magnetic loop sensor through the opening in the metallic mantle into the electromagnetic field TEM field in the waveguide cavity or surrounding the signal conductor and sampling a small part (ca. 0.1%) of the transported energy. The high directivity signal coupler (HDSC) offers following advantages: a) it is extremely compact, b) it is simple (FIG. 2), and c) the conical or recessed shape of the of the opening ensures control of the electric and magnetic field concentration to which the loop sensor 58 is exposed: the electric field in the border zone at the edges of the sensor (FIG. 5) leads to modified capacitively induced electric current compared with the associated magnetic current and by that to controlled (higher) directivity.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 4:
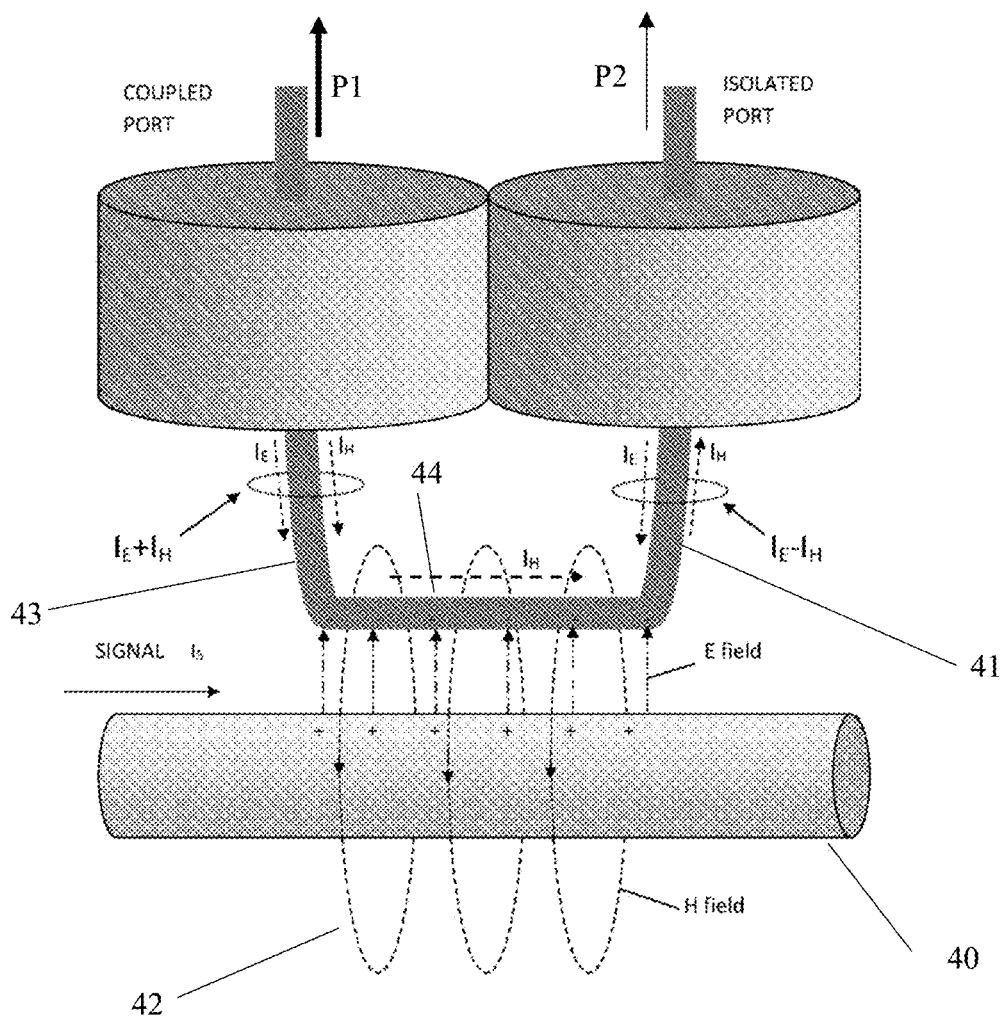
FIG. 4 depicts prior art, magnetically induced and capacitively coupled currents inside the coupling loop of a wire coupler of type wave-probe.

The high directivity bi-directional coupler in this embodiment uses a low loss cylindrical coaxial transmission airline, which is popular in RF technology. The signal coupling and isolation mechanism, first described in ref 6, works as follows (FIG. 4): the RF signal current Is inside the signal conductor 40 creates a magnetic field H around it 42. This magnetic field H 42 couples into the parallel to the center conductor 40 running bottom section of the wire loop sensor 41, 43 and creates a magnetically induced current $I_H$ which flows from branch 43 through the bottom of the "U" shaped loop 44 into branch 41. Since the bottom of the wire loop sensor runs parallel to the signal conductor 40 there is also a capacitive coupling between the two. This capacitive coupling induces capacitive current $I_E$ into the branches 41 and 43. These capacitive currents are proportional to the electric field in this region. Inside the coupled branch 43 the magnetically induced current $I_H$ and the electric one $I_E$ add yielding a total current $|I_H+I_E|$. Inside the isolated branch 41 these currents run antiphase and subtract $|I_H-I_E|$. The total signal power in the load terminating branch 43 is therefore $|I_E+I_H|^2*Zo$ and in the load terminating branch 41 $|I_H-I_E|^2*Zo$. This creates both the forward coupling into branch 43 and the isolation in branch 41.

Since the predominant coupling mechanism is magnetic, $I_H$ is always larger than $I_E$. Or, if we can increase $I_E$ and decrease $I_H$, the difference $I_H-I_E$ in isolated branch 41 tends towards zero. This increases isolation and directivity. At the same time, it also increases $I_H+I_E$; this increases forward coupling. The objective is therefore to increase $I_E$ and/or decrease $I_H$.

Figure 1:
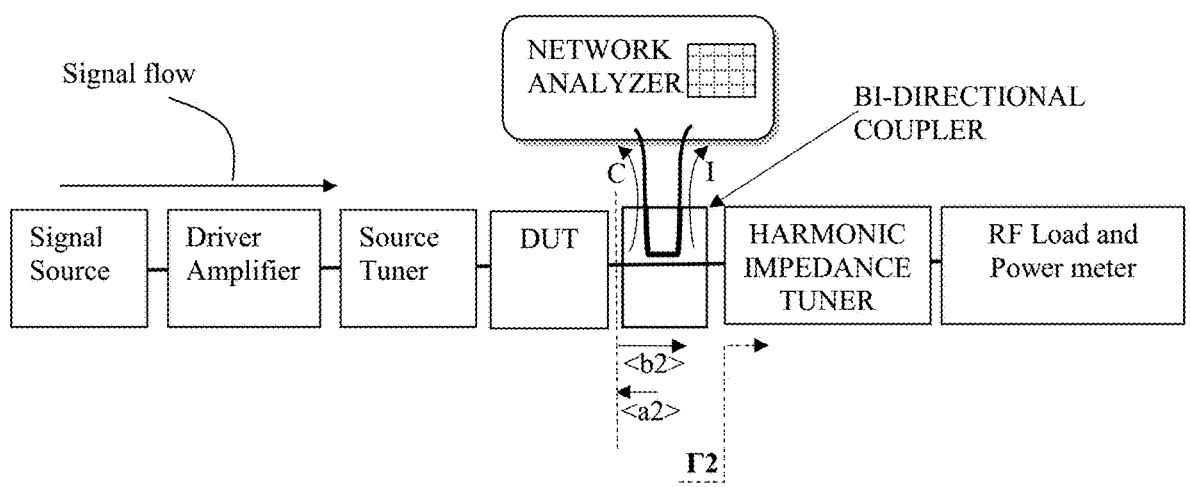
FIG. 1 depicts prior art a Load pull test setup for measuring power contours and real time incident and reflected waves and load reflection factor of a DUT, using bi-directional coupler and network analyzer.
Figure 2:
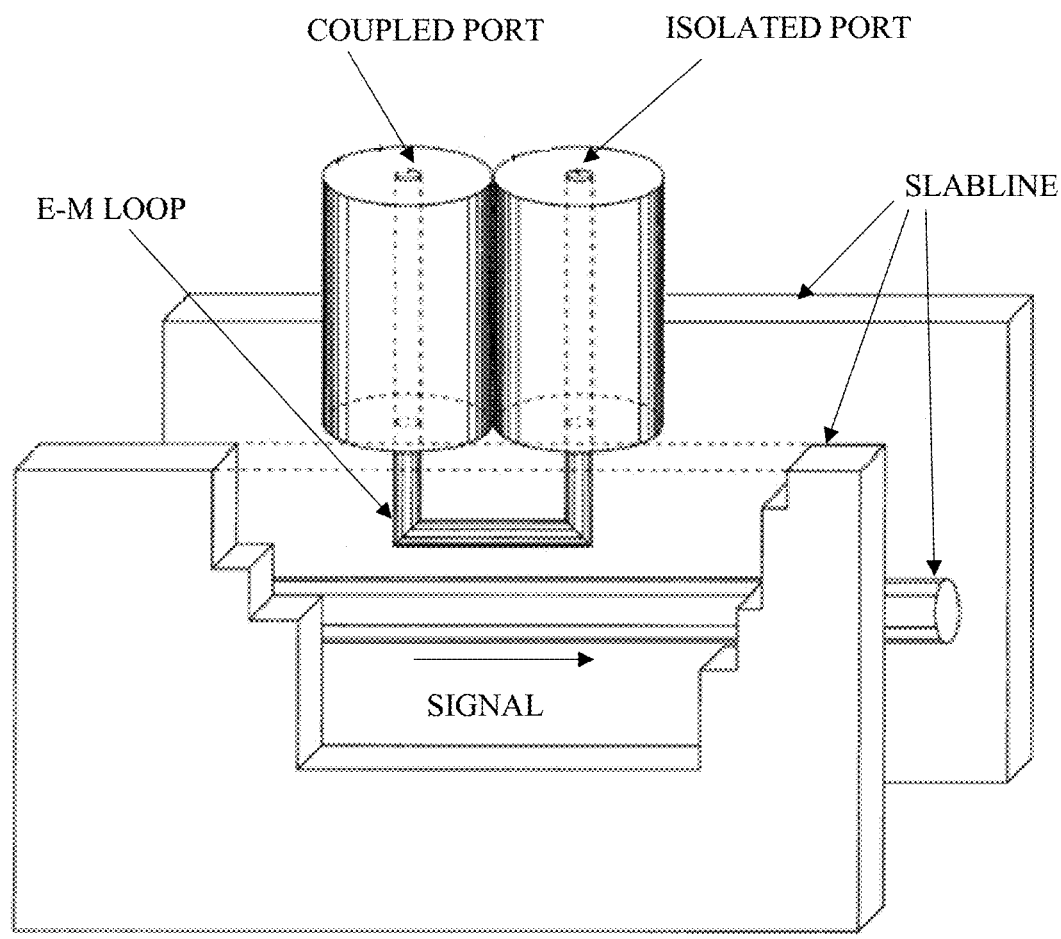
FIG. 2 depicts prior art, signal coupler of type "wave-probe".
Figure 3:
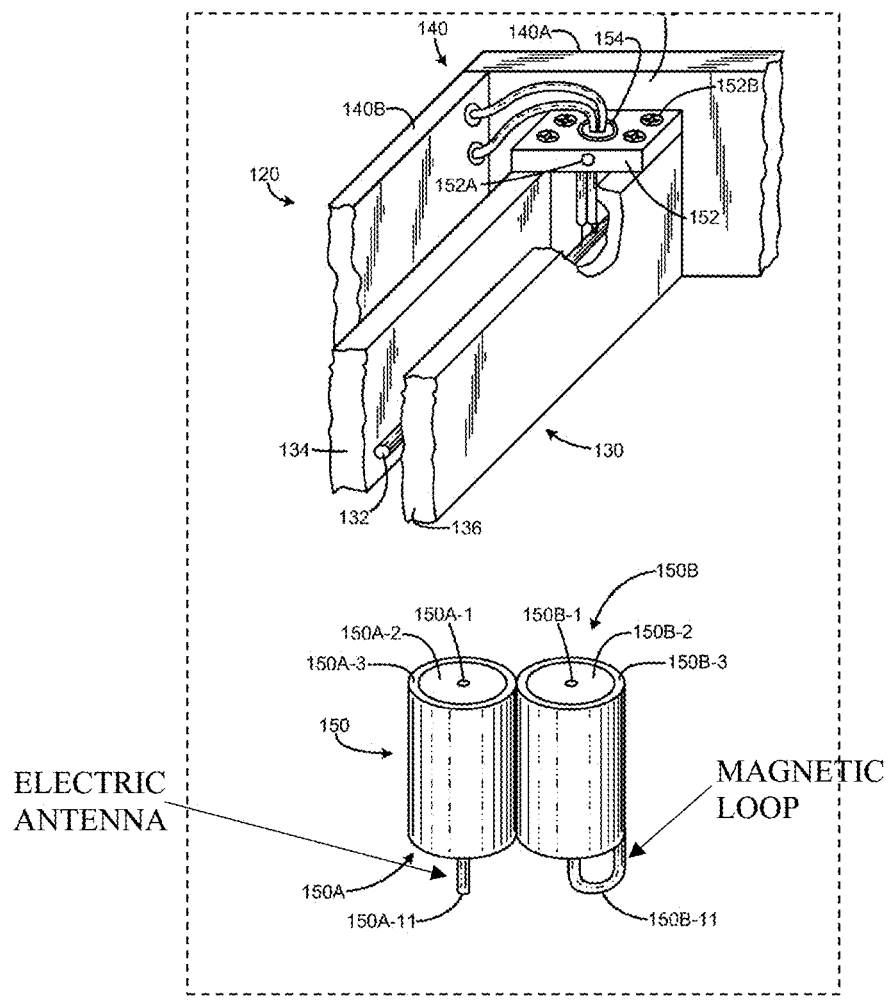
FIG. 3 depicts prior art, a voltage-current coupler of type I-V-probe.

A prior art wire loop sensor, also known as wave-probe (FIG. 2, see ref. 6) is placed in free space above the center conductor of a slabline in the region of low electric and moderate magnetic field shows low coupling and low directivity, compared with a coaxial structure where both the electric and magnetic fields are homogenous and stronger. A prior art I-V probe of FIG. 3 (see ref. 6), where the electric field antenna and the magnetic loop are placed separated in the same slabline structure and shows even poorer directivity and has failed in real time applications.

Figure 5:
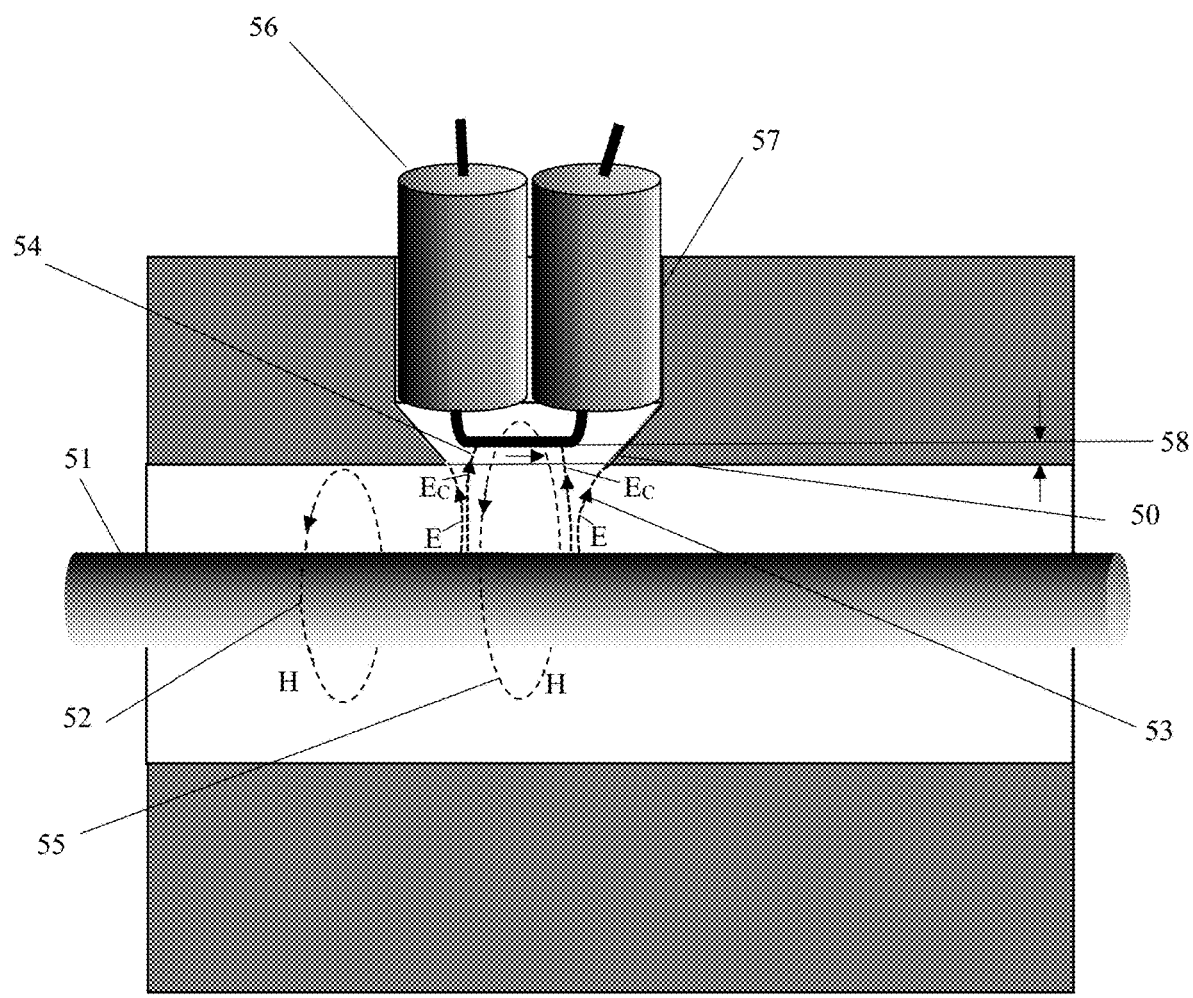
FIG. 5 depicts a first embodiment of the high directivity signal coupler, using a conical hole.
Figure 6:
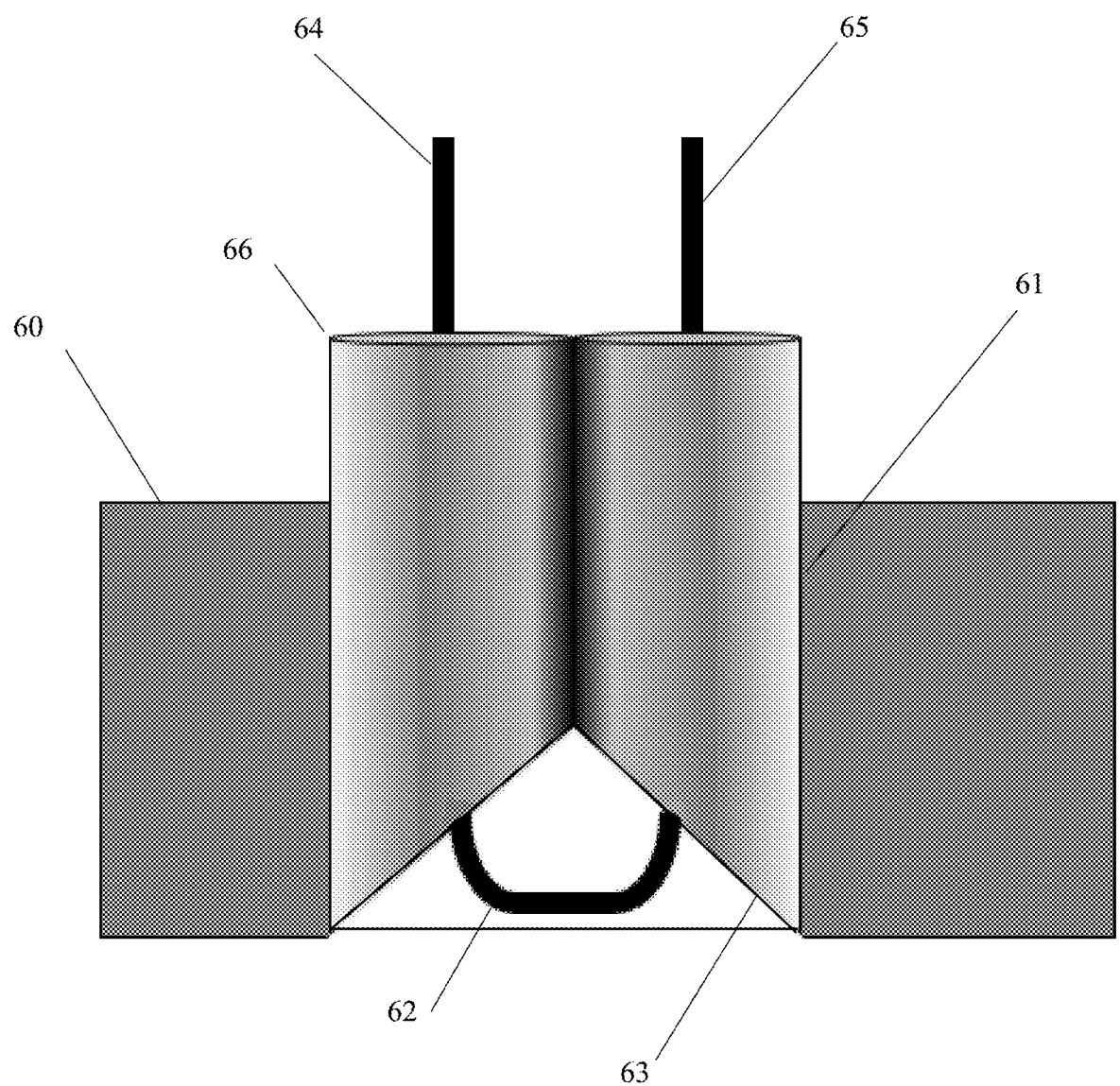
FIG. 6 depicts a second embodiment of the high directivity signal coupler using slanted sensor coaxial cables.
Figure 7:
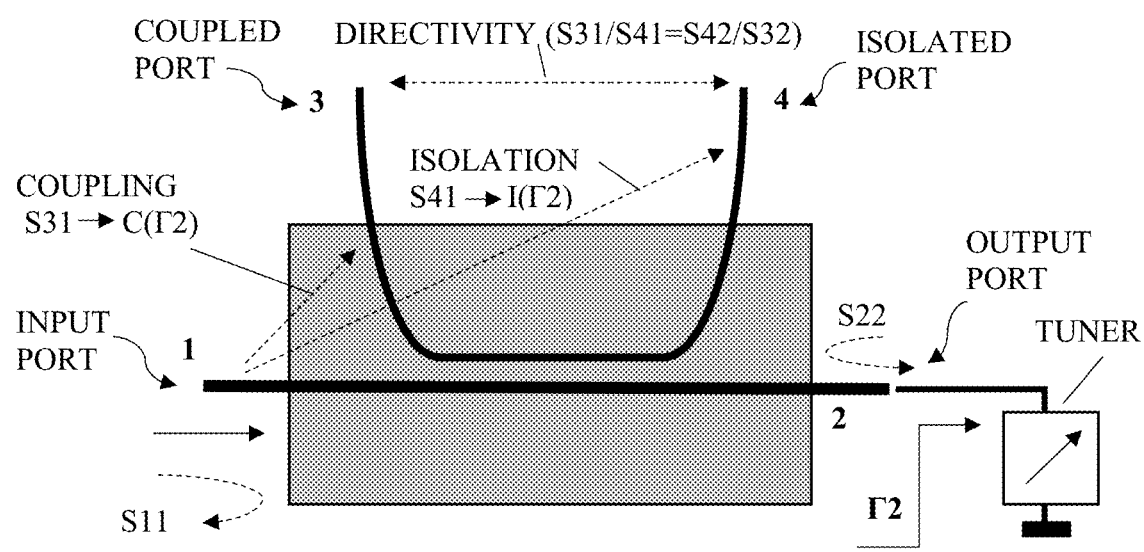
FIG. 7 depicts prior art, definition of transmission, reflection and coupling RF parameters in a directional coupler.
Figure 8:
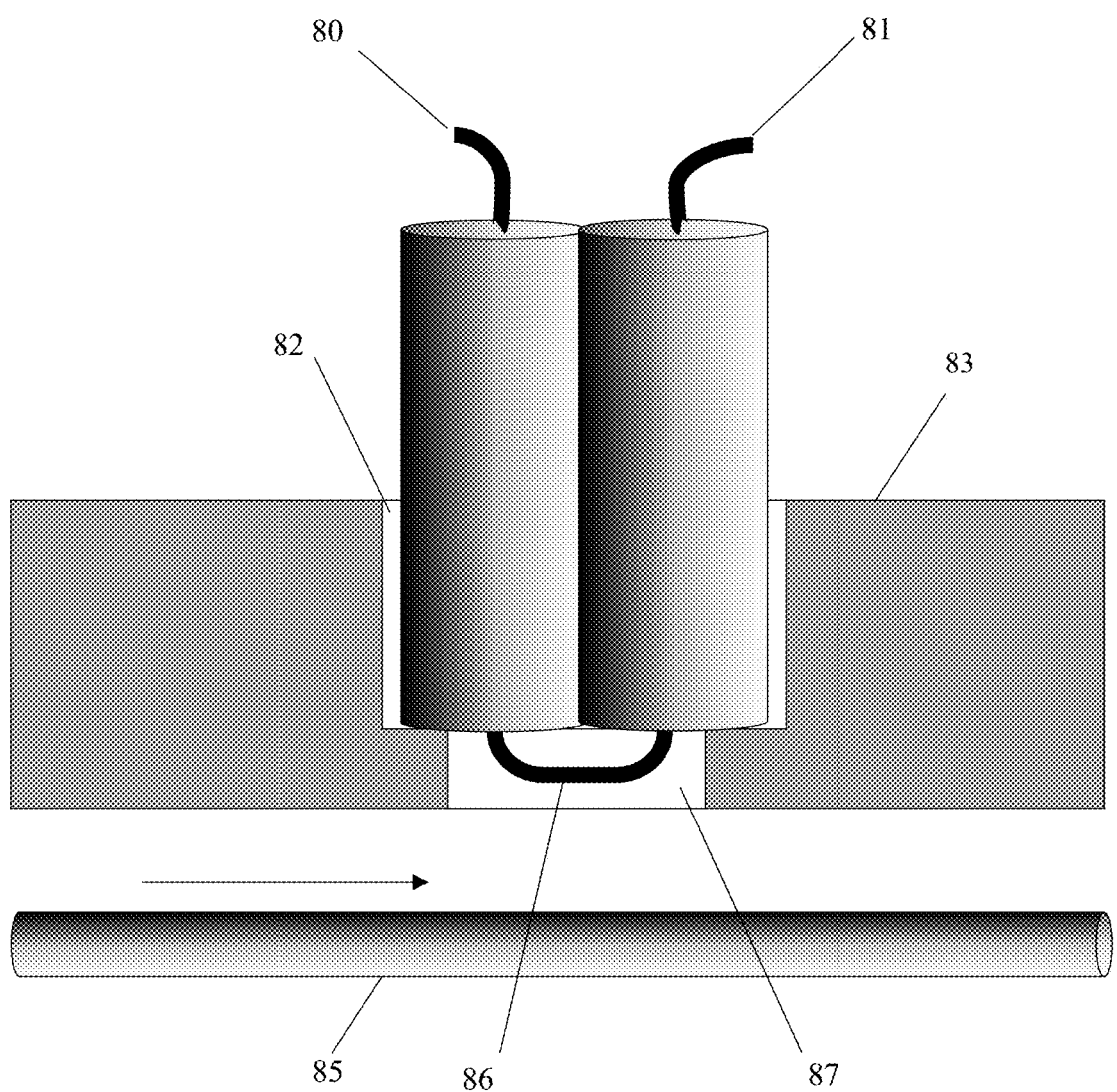
FIG. 8 depicts a third embodiment of the high directivity signal coupler, using a recessed opening.
Figure 9:
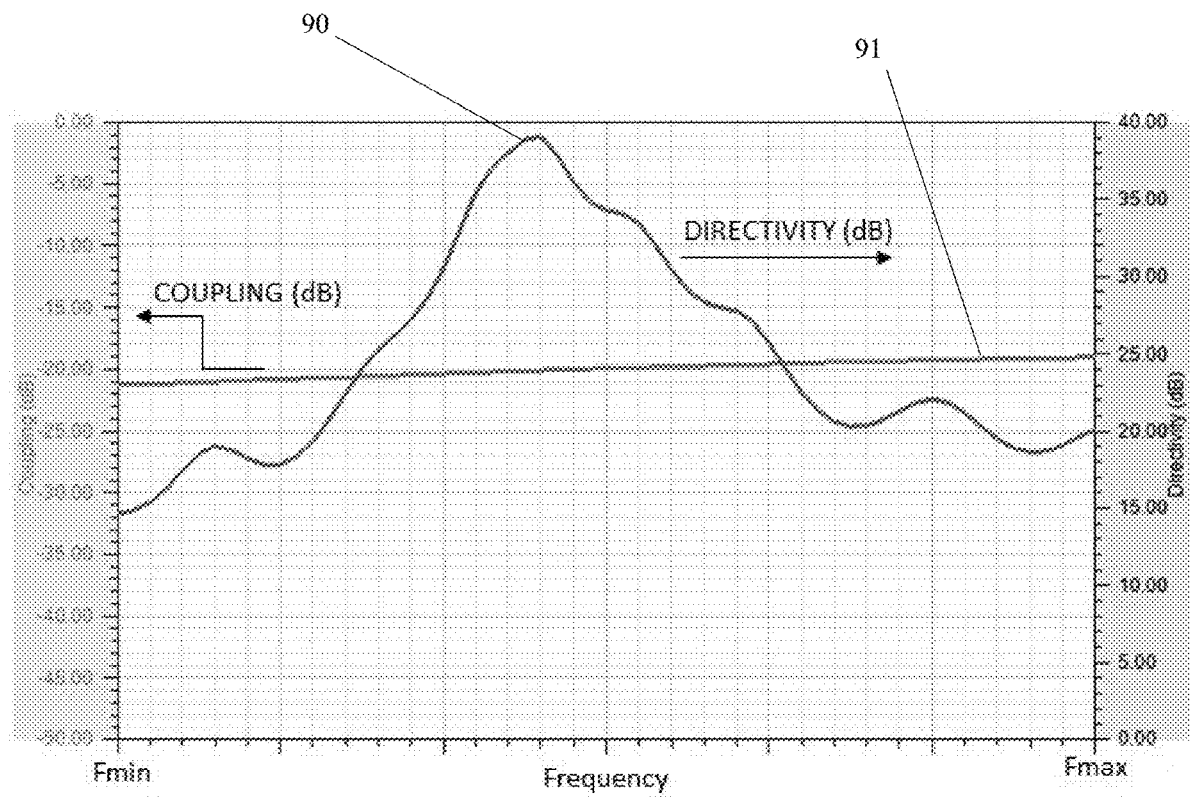
FIG. 9 depicts coupling and directivity data of the signal coupler of the first embodiment.

FIGS. 5, 6 and 8 show a number of embodiments allowing different electric versus magnetic field distributions with the objective of higher directivity compared with classic signal coupler designs: All herein presented embodiments use openings with a narrow iris towards the cavity of the airline. In the embodiment of FIG. 5 the electro-magnetic wire sensor 56 is inserted into a vertical hole 57, which has a conically shaped bottom section 50, which deforms the electric and magnetic field lines E and H. A reduced portion of the magnetic field 55 penetrates through the iris and induces a reduced current $I_H$ (FIG. 4) whereas the electric current $I_E$ (FIG. 4) is created only by the portion $E_C$ of the electric field. The modified ratio between $I_H$ and $I_E$ promotes the higher directivity as shown in FIG. 9.

In the embodiment of FIG. 8 the iris is created by a simple recess 87 of the hole 82 in the airline body 83, in which the wire loop 86 penetrates and couples with the center conductor 85, the effect is similar to the embodiment of FIG. 5 with similar directivity 80, 81 behavior. It has been found, in both cases that the ratio of the iris diameter to the diameter of the hole creates a resonant behavior 90 of very high directivity, as shown in FIG. 9, that can be shifted by this ratio. In short, the ratio "coupled 91 to leaked" ($|I_H+I_E|^2/|I_H-I_E|^2$) signal power, determining the coupler directivity, is manipulated by the form and dimensions of the opening 50 as well as the degree of penetration of the sensor conductor 58 into the electro-magnetic field zone of the airline cavity.

FIG. 6 depicts a third possible embodiment, which does not necessitate a special forming of the opening 61 of the mantle 60 into the cavity of the airline: the coaxial cables 66, 64, 65 are denuded slanted 63 under an angle of approximately 45 degrees and bent together to form an approximately 90 degrees corner angle with an exposed section of the center conductor 62 that forms the sensor conductor. The proximity of the coaxial mantle conductor and the easily adjustable penetration of the conductor 62 controlling the degree of electromagnetic coupling allow for the previously discussed directivity tuning. The penetration alone, affects coupling and directivity (reverse coupling) to a similar degree, though; it is the shape of the iris in FIGS. 5 and 8 which have an independent influence. The embodiment of FIG. 6 bears a potential problem if higher coupling and associated penetration is chosen, because the protruding coaxial cables into the cavity create higher residual reflection.

The protrusion of the sensor conductor into the high field area of the cavity of the airline (FIGS. 5, 6 and 8) may disturb the signal propagation and is, in any case, a reason of concern regarding the residual return and insertion loss of the coupler and must be taken into consideration.

In conclusion the new high directivity signal coupler embodiments shown are superior in coupling versus directivity ratio to prior art alternative embodiments. It also offers the benefit of "tuning" i.e., the shaping of the opening into the airline cavity towards an extremely high directivity without affecting the forward coupling capacity. Obvious alternatives and modifications to the herein disclosed general concept of using the shape of the opening into the airline cavity to optimize the directivity of the signal coupler shall not impede in the validity of the invention.

What is claimed is:

1. A high directivity bi-directional RF signal coupler having an input port, an output port, a coupled port, and an isolated port, comprising:
   a) a coaxial airline between the input and output ports, comprising an external metallic mantle and a center signal conductor traversing the coaxial airline and linking the input and output ports of the coaxial airline, and
   b) an electro-magnetic "U" shaped coupling sensor having two branches and a concave bottom segment, being inserted into a conical hole into the external metallic mantle and coupled in a contactless manner with the center signal conductor, said conical hole having a wide opening and a narrow opening, wherein the narrow opening of the conical hole faces the center signal conductor, and wherein the "U" shaped coupling sensor samples RF energy flowing forward and reverse inside the coaxial airline.

2. A high directivity bi-directional RF signal coupler having an input port, an output port, a coupled port, and an isolated port, comprising:
   a) a coaxial airline between the input and output ports comprising: an external metallic mantle and a center signal conductor traversing the coaxial airline and linking the input and output ports of the coaxial airline, and
   b) an electro-magnetic "U" shaped coupling sensor having two branches and a concave bottom segment, being inserted into a recessed perpendicular hole in the external metallic mantle and coupled in a contactless manner with the center signal conductor, said recessed hole having a wide opening and a narrow opening, wherein;

the narrow opening of the recessed perpendicular hole in the external metallic mantle faces the center signal conductor of the coaxial airline, and wherein;

the "U" shaped coupling sensor samples RF energy flowing forward and reverse inside the coaxial airline.

3. A high directivity bi-directional RF signal coupler having an input port, an output port, a coupled port, and an isolated port, comprising:
   a) a coaxial airline between the input and output ports comprising: an external metallic mantle and a center signal conductor traversing the coaxial airline between the input and output ports, and
   b) an electro-magnetic "U" shaped coupling sensor being inserted into a perpendicular hole in the external metallic mantle of the coaxial airline and coupled in a contactless manner with the center signal conductor and having two branches and a concave bottom segment, wherein;

the two branches of the "U" shaped coupling sensor are coaxial cables with a center conductor, dielectric filling and conductive outer shell and terminate into either the coupled or the isolated port, and wherein;

the coaxial cables are stripped by removing the conductive outer shells and the dielectric fillings slanted by 45 degrees to expose a portion of the center conductor of the coaxial cables which forms the bottom segment of the electro-magnetic "U" shaped coupling sensor.

4. The high directivity bi-directional RF signal coupler of claim 1, wherein;
   a characteristic impedance of the coaxial airline is 50 Ohms.

5. The high directivity bi-directional RF signal coupler of claim 1 or 2 or 3, wherein;
   the bottom section of the "U" shaped electro-magnetic sensor runs parallel to the center conductor of the coaxial airline.

* * * * *